(12) United States Patent
Han et al.

(10) Patent No.: US 11,726,144 B2
(45) Date of Patent: Aug. 15, 2023

(54) APPARATUS AND METHOD FOR DETECTING RESISTIVE LEAKAGE CURRENT IN SURGE ARRESTER

(71) Applicant: KOREA WATER RESOURCES CORPORATION, Daejeon (KR)

(72) Inventors: Song Yop Han, Seoul (KR); Jeong Woo Lee, Cheongju-si (KR); Kwang Ho Lee, Okcheon-gun (KR)

( * ) Notice: Subject to any disclaimer, the term of this patent is extended or adjusted under 35 U.S.C. 154(b) by 0 days.

(21) Appl. No.: 16/497,653

(22) PCT Filed: Sep. 20, 2019

(86) PCT No.: PCT/KR2019/012281
§ 371 (c)(1),
(2) Date: Oct. 25, 2019

(87) PCT Pub. No.: WO2020/256221
PCT Pub. Date: Dec. 24, 2020

(65) Prior Publication Data
US 2023/0052897 A1 Feb. 16, 2023

(30) Foreign Application Priority Data
Jun. 17, 2019 (KR) .......................... 10-2019-0071516

(51) Int. Cl.
*G01R 31/52* (2020.01)
*G01R 19/165* (2006.01)
*H02H 9/04* (2006.01)

(52) U.S. Cl.
CPC ....... *G01R 31/52* (2020.01); *G01R 19/16571* (2013.01); *H02H 9/04* (2013.01)

(58) Field of Classification Search
CPC ........... G01R 31/52; H02H 9/04; H02H 3/048
See application file for complete search history.

(56) References Cited

U.S. PATENT DOCUMENTS

2004/0066598 A1* 4/2004 Gudmundsson ....... H02H 3/048
361/118
2006/0203412 A1* 9/2006 Schillert ................ H01C 7/126
361/118

(Continued)

*Primary Examiner* — Patrick Assouad
*Assistant Examiner* — Demetrius R Pretlow
(74) *Attorney, Agent, or Firm* — Antonio Ha & U.S. Patent, LLC

(57) ABSTRACT

The present invention performs a reference point detecting step (S20) to select a reference point by performing pattern analysis based on a characteristic pattern shown in a total leakage current ($I_T$) when an applied voltage is 0V, a resistive leakage current calculating step (S30) to calculate a resistive leakage current by Fourier series-expanding the total leakage current ($I_T$) starting at the reference point, and reference point verifying/correcting steps (S40 and S41) to correct the reference point until a characteristic pattern of the resistive leakage current ($I_R$) according to non-linear resistance characteristics of the surge arrester (1) is shown so that the resistive leakage current ($I_R$) is recalculated, and the present invention determines that the resistive leakage current ($I_R$) calculated based on the completely corrected reference point is the resistive leakage current of the surge arrester (1).

12 Claims, 8 Drawing Sheets

(56) References Cited

U.S. PATENT DOCUMENTS

| | | | |
|---|---|---|---|
| 2016/0134105 A1* | 5/2016 | Harris | H02H 3/16 |
| | | | 361/91.1 |
| 2016/0261106 A1* | 9/2016 | Westerlund | H02H 3/22 |
| 2016/0363620 A1* | 12/2016 | Choe | G01R 31/2829 |
| 2017/0045567 A1* | 2/2017 | Yong | G01R 31/1236 |
| 2017/0108550 A1* | 4/2017 | Raschke | H02H 9/042 |
| 2020/0271695 A1* | 8/2020 | Westerlund | G01R 15/18 |
| 2020/0388456 A1* | 12/2020 | Chovanec | H02H 9/04 |

\* cited by examiner

APPARATUS AND METHOD FOR DETECTING RESISTIVE LEAKAGE CURRENT IN SURGE ARRESTER

TECHNICAL FIELD

The present invention relates to resistive leakage current in a surge arrester that measures not voltage but leakage current alone in the surge arrester to obtain a resistive leakage current included in the leakage current so as to compensate for shortcomings of conventional leakage current measurement methods in metal-oxide surge arresters.

BACKGROUND ART

Surge arresters are installed not only in Korea but also in many other countries to protect such electric devices as voltage transformers and circuit breakers connected with electric power systems from abnormal voltage due to lightening strikes or switching surges. Recently, metal-oxide surge arrestors are widely in use.

Metal-oxide surge arresters have non-linear resistance characteristics, are of a gapless type with a low limit voltage and superior discharge characteristics, and, in their normal, non-deteriorated state, have a very low leakage current although the leakage current soars if aging-degraded by lightening strikes or long-term application of operation voltage. Further, since surge arresters may not work properly due to heat generated by leakage current if leakage current goes up to a certain level or more, leakage current needs to be regularly measured and monitored and, if the leakage current is a reference value or higher, the surge arrester needs to be replaced.

Referring to FIG. 1, which is an equivalent circuit diagram, a surge arrester 2 may be modeled as a circuit of a non-linear resistor R and a capacitor C connected in parallel with each other. Thus, the total leakage current $I_T$ flowing through the surge arrester installed between the system bus 2 and the ground line 3 is detected as the sum of the resistive leakage current $I_R$ and the capacitive leakage current $I_C$.

$$I_T = I_C + I_R \quad \text{[Equation 1]}$$

The resistive leakage current $I_R$ flowing through the surge arrester is very low when the instant value of voltage applied is small and, when the voltage applied rises to some level or more, the voltage exponentially increases. Thus, the resistive leakage current $I_R$ flowing through the non-linear resistor R when a system voltage u is applied to the system bus 2 may be modeled as in Equation 2.

$$I_R = K u^\alpha \quad \text{[Equation 2]}$$

In Equation 2 above, K and $\alpha$ are constants determined depending on the characteristics of the material used in the surge arrester, and $\alpha$ is the constant to determine the non-linear current characteristics, which is typically 11, 13, or 15.

Since the capacitive leakage current $I_C$ flowing through the surge arrester is current flowing through the capacitor C, if the system voltage u is detected and its waveform is known, the capacitive leakage current $I_C$ may be obtained by differentiating the system voltage u which is represented as in Equation 3.

$$I_C = C \frac{du}{dt} \quad \text{[Equation 3]}$$

However, if the surge arrester degrades, the capacitance C is nearly constant so that the capacitive leakage current $I_C$ makes no or little variation, but the non-linear resistance R gradually decreases so that the resistive leakage current $I_R$ increases.

Thus, to precisely determine the degraded state of the surge arrester, it is most preferable to determine the state of degradation by measuring the resistive leakage current $I_R$ among leakage currents flowing through the surge arrester.

However, it is hard to directly measure the resistive leakage current $I_R$, and indirect methods have conventionally been used to measure the resistive leakage current $I_R$.

Referring to the conventional method using the system voltage u as disclosed in Korean Patent No. 10-1086878, after the system voltage u applied to a surge arrester and the total leakage current $I_T$ flowing through the surge arrester are simultaneously detected, the capacitive leakage current $I_C$ is extracted using the voltage (du/dt) obtained by differentiating the system voltage u and the detected total leakage current $I_T$, the resistive leakage current $I_R$ is obtained by subtracting the capacitive leakage current $I_C$ from the total leakage current $I_T$, and the state of degradation is determined based on the resistive leakage current $I_R$.

However, a potential transformer (PT) which drops the voltage of the system voltage u and measures the system voltage u is needed for measuring the system voltage u. Typically, a surge arrester is installed far away from the potential transformer, so that it is difficult to connect a cable to the potential transformer. Also hard is adding a potential transformer in the position where the surge arrester has been installed. In particular, it is very hard to add a system voltage (u) measurement functionality to a portable resistive leakage current detector.

Thus, widely adopted methods are measuring the third harmonic of the total leakage current which may easily be measured in the position of the surge arrester to determine the state of degradation of the surge arrester. As an example, the method disclosed in Korean Patent No. 10-0988027, although adding comparison between reference values and the total leakage current, amplitude spectrum, error rate, phase, and effective current, is fundamentally based on comparison between the amplitude of the third harmonic and a reference value.

The theoretical basis for the third harmonic-based method is as follows.

Equation 4 is obtained by detecting the total leakage current $I_T$ during one period and Fourier series-expanding the same including the fundamental and odd-numbered harmonic components.

$$I_T(t) = \sum_{m=1}^{9} a_m \cos(m\omega t) + \sum_{m=1}^{9} b_m \sin(m\omega t), \, m = 1, 3, 5, 7, 9 \quad \text{[Equation 4]}$$

In Equation 4, m denotes the order of the harmonics. For electric power systems, it will suffice to consider first-order to the ninth-order harmonic component. Thus, in Equation 4, first-order to the ninth-order harmonic component is included. $a_m$ and $b_m$ are the Fourier coefficients which are the peaks of the mth-order harmonic components. $\omega$ denotes $2\pi f$ resultant from applying the system frequency (f).

As can be seen from Equations 2 and 3 above, the resistive leakage current $I_R$ is in-phase with the system voltage u, and the capacitive leakage current $I_C$ is a lead-phase current whose phase 90-degree leads the resistive leakage current $I_R$. However, since when only the total leakage current $I_T$ is measured, the phase of the system voltage u is not known and, if the start point of one period varies, the Fourier series is also varied, it is impossible to obtain the resistive leakage current $I_R$ and the capacitive leakage current $I_C$ directly from Equation 4.

In contrast, if Equation 4 is transformed into Equation 5 which has only sine waves, although the start point of one period is changed, the peak $C_n$ of the total leakage current harmonics which remain unchanged may be obtained.

[Equation 5]
$$I_T(t) = \sum_{m=1}^{9} c_m \sin(m\omega t + \theta_m), m = 1, 3, 5, 7, 9$$

$$c_m = \sqrt{a_m^2 + b_m^2}, \quad \theta_m = \arctan\left(\frac{a_m}{b_m}\right)$$

In other words, since the peak value $C_m$ is the coefficient of the vector sum of the harmonics of the resistive leakage current $I_R$ and the harmonics of the capacitive leakage current $I_C$ in Equation 5, the same value may be obtained whatever interval is determined as one period for Fourier series expansion of the total leakage current $I_T$ with the period of the system frequency f.

However, if the system voltage u lacks the third-order harmonic component, the capacitive leakage current $I_C$ has no third-order harmonic component as well. Resultantly, the peak value C3 of the third-order harmonic component obtained from the total leakage current $I_T$ is the same as the peak value of the third-order harmonic component of the resistive leakage current $I_R$.

Conventionally, the Fourier series of the third-order harmonic component was obtained under the assumption that the third-order harmonic component of the system voltage u is very small and was regarded as the third harmonic peak value of the resistive leakage current $I_R$. Degradation was diagnosed depending on the size of the Fourier series of the third-order harmonic component.

However, since in the actual electric power system, the voltage of the third-order harmonic component is present in the system voltage u, diagnosis of degradation based on the third-order harmonic component may significantly lower accuracy, and the result of diagnosis may be much less reliable.

As per other conventional approaches disclosed in Korean Patent No. 10-0498927 and Japanese Patent Application Publication No. 2017-122666, a reference waveform is selected and is compared with the waveform of the total leakage current $I_T$ and is analyzed, or the reference waveform is synthesized with a delayed waveform of the total leakage current $I_T$ waveform and is compared and analyzed, thereby obtaining the resistive leakage current $I_R$. However, these methods may cause errors due to instantaneous variations and noise, with the result of low accuracy in diagnosis.

In other words, a preferable method may be directly detecting the resistive leakage current by extracting the fundamental component of the system frequency and a harmonic component of major interest from the components of the resistive leakage current caused in the surge arrester connected to an electric power system and then synthesizing them.

PRIOR TECHNICAL DOCUMENTS

Patent Documents (Patent Document 1) KR 10-1086878 B 1, Oct. 18, 2011
(Patent Document 2) KR 10-0988027 B 1, Oct. 8, 2010
(Patent Document 3) KR 10-0498927 B 1, Jun. 23, 2005
(Patent Document 4) JP 2017-122666 A, Jul. 13, 2017

DETAILED DESCRIPTION OF THE INVENTION

Technical Problems

Therefore, an object of the present invention is to provide an apparatus and method of detecting a surge arrester resistive leakage current, which may measure a total leakage current flowing through a surge arrester and then Fourier series-expands the total leakage current to thereby detect the fundamental wave component and a harmonic component of interest of the resistive leakage current and synthesize the detected components to thereby obtain the resistive leakage current.

Technical Solutions

To achieve the foregoing objects, according to the present invention, a method of detecting a surge arrester resistive leakage current includes a total leakage current detecting step (S10) to detect a total leakage current ($I_T$) flowing through a surge arrester (1) to which a voltage has been applied, a reference point detecting step (S20) to detect a time when a voltage is 0V based a characteristic pattern shown in the total leakage current ($I_T$) when the applied voltage is 0V and to select the time as a reference point, a resistive leakage current calculating step (S30) to calculate a resistive leakage current ($I_R$) by adding a term, which is in phase with a voltage which is 0V at the reference point, of a Fourier series of the total leakage current ($I_T$) for one period starting at the reference point, reference point verifying/correcting steps (S40 and S41) to correct the reference point until the calculated resistive leakage current ($I_R$) shows a characteristic pattern of the resistive leakage current ($I_R$) according to non-linear resistance characteristics of the surge arrester (1) and to repeat the resistive leakage current calculating step (S30), and a resistive leakage current determining step (S50) to determine that the resistive leakage current ($I_R$) calculated based on the completely corrected reference point is the resistive leakage current of the surge arrester (1).

To achieve the foregoing objects, according to the present invention, a surge arrester resistive leakage current detector includes a leakage current detecting unit (10) to detect a total leakage current ($I_T$) flowing through a surge arrester (1) to which a voltage has been applied, a reference point detecting unit (20) to detect a time when a voltage is 0V based a characteristic pattern shown in the total leakage current ($I_T$) when the applied voltage is 0V and to select the time as a reference point, a resistive leakage current calculating unit (31) to calculate a resistive leakage current ($I_R$) by adding a term, which is in phase with a voltage which is 0V at the reference point, of a Fourier series of the total leakage current ($I_T$) for one period starting at the reference point, and a reference point verifying/correcting unit (32) to correct the reference point until the calculated resistive leakage current ($I_R$) shows a characteristic pattern of the resistive leakage current ($I_R$) according to non-linear resistance characteristics of the surge arrester (1) and to repeat the resistive leakage current calculating and to determine that the resistive leakage current ($I_R$) calculated based on the completely corrected reference point is the resistive leakage current of the surge arrester (1).

Effects of the Invention

The present invention configured as above may detect only the total leakage current which may be measured in practice, detect the time when the voltage applied to the surge arrester is 0V, extract the resistive leakage current from the Fourier series of the total leakage current, and correct the detected time when the voltage is 0V based on the non-linear resistance characteristics of the surge arrester 1, thereby obtaining the resistive leakage current using the Fourier series in a more precise manner.

According to an embodiment, the present invention selects the time when the applied voltage is 0V based on symmetry which is shown in the total leakage current of the surge arrester with respect to the time when the applied voltage is 0V and may precisely detect the time when the applied voltage is 0V based on the characteristics of the surge arrester.

According to an embodiment, the present invention may precisely obtain the resistive leakage current in a simplified way of extracting the sine term from the Fourier series of the total leakage current. Further, the present invention may provide data for analysis of the leakage current of harmonics.

According to an embodiment, the present invention may more precisely correct the time when the applied voltage is 0V using the characteristic pattern of the resistive leakage current shown within a predetermined interval with respect to the time when the applied voltage is 0V and may also obtain the resistive leakage current in a more accurate manner.

According to an embodiment, the present invention may stepwise correct and detect the time when the applied voltage is 0V considering the both-side boundary condition of the category able to be regarded as the characteristic pattern of the resistive leakage current in detecting the time when the applied voltage is 0V, precisely obtaining the resistive leakage current despite influence by noise or detection errors.

BEST MODE FOR PRACTICING THE INVENTION

In an apparatus and method of detecting a surge arrester resistive leakage current according to the present invention, the position where the voltage applied to a surge arrester 1 is 0V is detected from the waveform diagram of a total leakage current $I_T$ flowing through the surge arrester 1, the detected position is selected as a reference point, a one-period total leakage current $I_T$ starting at the reference point is Fourier series-expanded, and only the resistive leakage current $I_R$ component is extracted from the Fourier series of the total leakage current $I_T$ based on the applied voltage and the resistive leakage current $I_R$ being in-phase with each other.

Thus, the present invention may obtain the waveform of the resistive leakage current $I_R$ by synthesizing the fundamental wave component and each harmonic component of the resistive leakage current $I_R$ extracted from the Fourier series of the total leakage current $I_T$. Thus, the present invention may detect the resistive leakage current $I_R$ by measuring the total leakage current $I_T$ alone without measuring the applied voltage.

The present invention is required to precisely obtain the reference point to be able to extract the component of the resistive leakage current $I_R$ and, thus, the present invention sufficiently utilizes the feature pattern of the waveform.

Thus, embodiments of the present invention are described after clarifying the theoretical basis for the present invention by looking into the context where the reference point where the voltage applied to the surge arrester 1 is obtained precisely.

Figure 1:
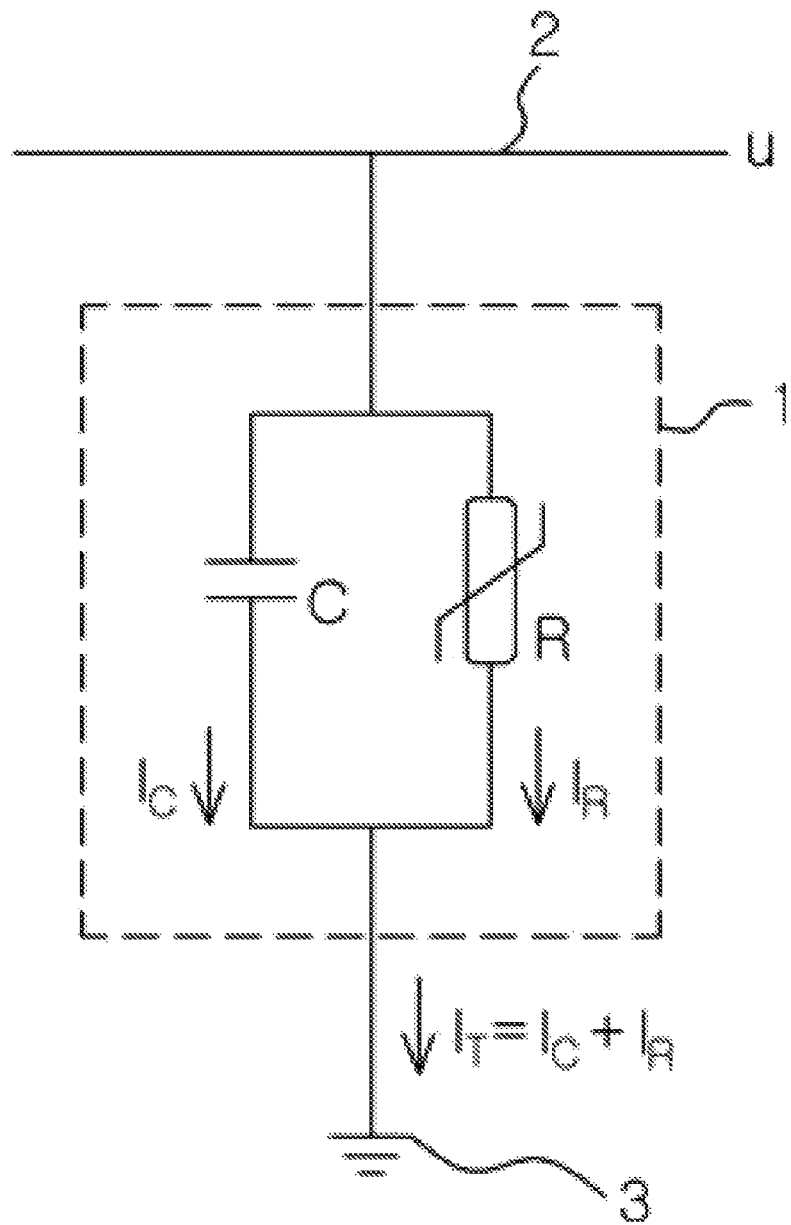
FIG. 1 is an equivalent circuit diagram of a surge arrester.

As shown in FIG. 1, a metal-oxide surge arrester 1 may be represented as an equivalent circuit with a capacitor C and a non-linear resistor R connected in parallel with each other. If the surge arrester 1 is connected between the system bus 2 of an electric power system and the ground 3, the system voltage u is applied so that a total leakage current $I_T$ which is the sum of a capacitive leakage current $I_C$ and a resistive leakage current $I_R$ flows to the ground.

The capacitive leakage current $I_C$ and the resistive leakage current $I_R$ may be detected as below by Fourier series-expanding the total leakage current $I_T$ for one cycle which is detected with the time when the system voltage u is 0V set as the start point.

Figure 2:
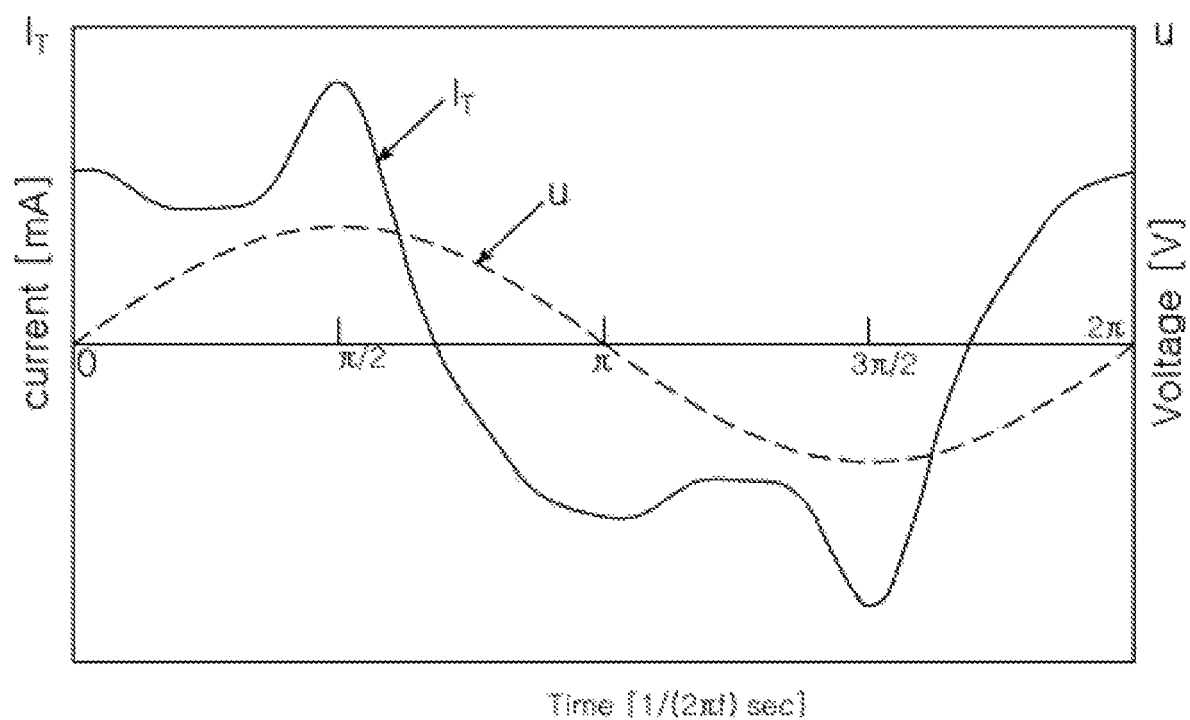
FIG. 2 is a waveform diagram illustrating a total leakage current $I_T$ detected during one period at a system frequency f, using a time when a system voltage u applied to a surge arrester is 0V as a start point.

FIG. 2 is a waveform diagram illustrating a total leakage current $I_T$ detected during one period at a system frequency f, using a time when a system voltage u applied to a surge arrester is 0V as a start point. In FIG. 2, the waveform shown in the solid line is the total leakage current $I_T$, and the waveform shown in the dashed line is the system voltage u.

Figure 3:
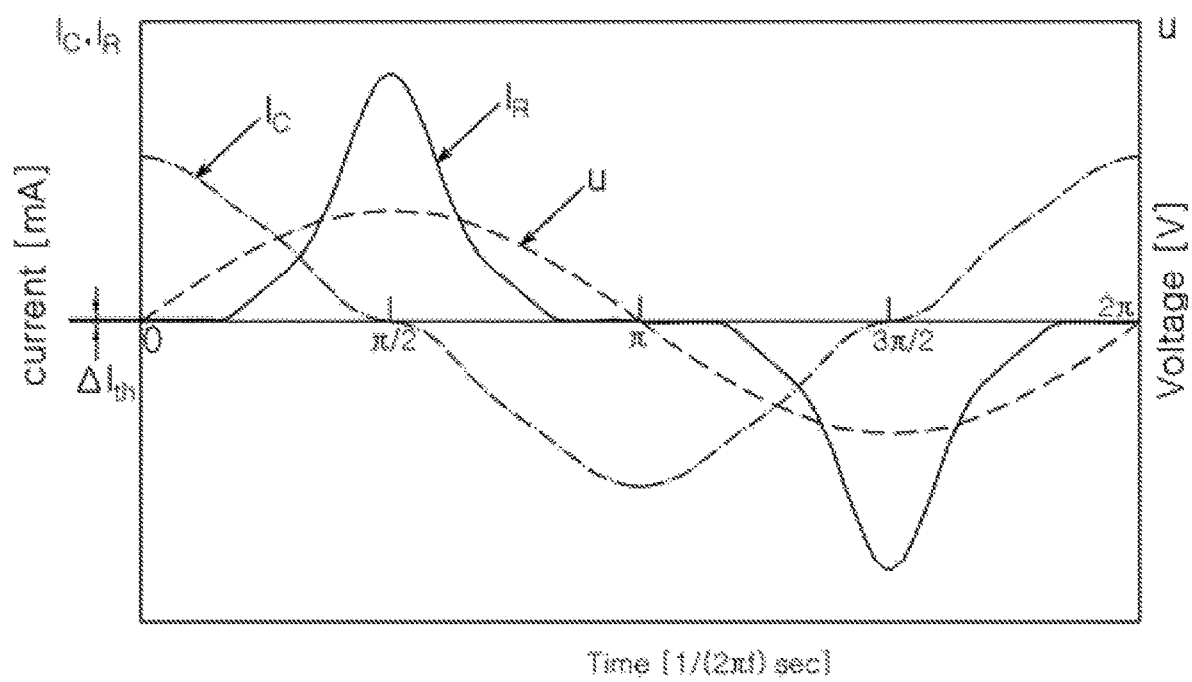
FIG. 3 is a waveform diagram of a resistive leakage current $I_R$ and a capacitive leakage current $I_C$ extracted by Fourier series-expanding the total leakage current $I_T$ of FIG. 2.

FIG. 3 is a waveform diagram of a resistive leakage current $I_R$ and a capacitive leakage current $I_C$ extracted by Fourier series-expanding the total leakage current $I_T$ of FIG. 2. In FIG. 3, the waveform shown in the solid line is the resistive leakage current $I_R$, the waveform shown in the dot-dashed line is the capacitive leakage current $I_C$, and the waveform shown in the dashed line is the system voltage u.

The system voltage u includes harmonics, but commonly the harmonics up to the ninth order are considered in analyzing the leakage current at the surge arrester. That is, only the fundamental wave, which is of the first order, the third-order harmonic, the fifth-order harmonic, the seventh-order harmonic, and the ninth-order harmonic are taken into account.

Thus, the system voltage u using the position of 0V as the start point in the rising interval as shown in FIG. 2 may be represented as in Equation 6 below.

$$u(t) = \sum_{m=1}^{9} u_m(t) = \sum_{m=1}^{9} u_{MAX,m} \sin(m\omega t), \ m = 1, 3, 5, 7, 9 \quad \text{[Equation 6]}$$

Here, um(t) is the mth-order component, $u_{MAX,m}$ is the peak value of the mth-order component, and ω is 2πf, where f is the system frequency.

Equation 7 below is obtained by Fourier series-expanding the total leakage current $I_T$ for one period which uses, as the reference point, the position of ωt=0, i.e., the position of 0V in the interval where the system voltage u rises. Here, only the first-order, third-order, fifth-order, seventh-order, and ninth-order terms are considered.

$$I_T(t) = \sum_{m=1}^{9} a_m \cos(m\omega t) + \sum_{m=1}^{9} b_m \sin(m\omega t), \ m = 1, 3, 5, 7, 9 \quad \text{[Equation 7]}$$

Here, the capacitive leakage current $I_C$ is a lead-phase current whose phase 90-degree leads the system voltage u, and the resistive leakage current $I_R$ is an in-phase current which has the same phase as the system voltage u. Thus, in Equation 7, the cosine term corresponds to the component of the capacitive leakage current $I_C$, and the sine term corresponds to the component of the resistive leakage current $I_R$, so that the capacitive leakage current $I_C$ and the resistive leakage current $I_R$ may be obtained from Equation 8 below.

$$I_C(t) = \sum_{m=1}^{9} a_m \cos(m\omega t), \ m = 1, 3, 5, 7, 9 \quad \text{[Equation 8]}$$

$$I_R(t) = \sum_{m=1}^{9} b_m \sin(m\omega t), \ m = 1, 3, 5, 7, 9$$

The capacitive leakage current $I_C$ and the resistive leakage current $I_R$ thusly obtained may be represented in the waveforms shown in FIG. 3. FIG. 3 shows the total leakage current detected from the surge arrester 1 which has been degraded so that somewhat much resistive leakage current $I_R$ flows. If the surge arrester 1 has not been degraded, the resistive leakage current would be relatively small than the capacitive leakage current.

Since the capacitive leakage current $I_C$ is a leakage current rendered to flow by the capacitor C, the capacitive leakage current $I_C$ may be represented as:

$$I_C = C \frac{du}{dt}.$$

Since the resistive leakage current $I_R$ is a leakage current rendered to flow by the non-linear resistor R with contants K and a which are determined depending on the material characteristics of the elements used for the surge arrester, the resistive leakage current $I_R$ may be represented as: $I_R = Ku^\alpha$. The waveform diagram of FIG. 3 reflects the current patterns according to the equations.

Here, Applicant have noted the following characteristic patterns.

As the first characteristic pattern, since the resistive leakage current $I_R$ is in phase with the system voltage u, the resistive leakage current $I_R$ shows its peak value in the phase of ωt=π/2 as does the system voltage u, and the resistive leakage current $I_R$ is left-right symmetric with respect to its peak value.

Further, the resistive leakage current $I_R$ is small enough to be neglectible from the time of ωt=0 to a predetermined interval by the nature of the non-linear resistor R. For example, in the case α, the instantaneous value of the resistive leakage current $I_R$ at ωt=π/6 is about 0.01% of the peak value.

This may be generalized as follows. The resistive leakage current $I_R$ may be smaller than the tiny current $\Delta I_{th}$ from the time of ωt=0 to a predetermined interval as shown in FIG. 3 and may thus be regarded as substantially 0 A. If this is applied to the above example, the resistive leakage current which is smaller than $\Delta I_{th}$ (0.01% of the peak value) flows during the interval where ωt is 0 to π/6, it may be regarded as 0 A flowing.

The second characteristic pattern is as follows. Since the resistive leakage current $I_R$ is small enough to be neglectible in the range of ωt=−π/6 to π/6, the total leakage current $I_T$ in the range may be regarded as the capacitive leakage current $I_C$.

The third characteristic pattern is that since the capacitive leakage current $I_C$ is a cosine function, the point of ωt=0 becomes the symmetry point in the range of ωt=−π/6 to π/6.

An embodiment of the present invention utilizes the above-mentioned three characteristic patterns to obtain the resistive leakage current $I_R$ from the total leakage current $I_T$.

Hereinafter, preferred embodiments of the present invention are described with reference to the accompanying drawings to be easily practiced by one of ordinary skill in the art.

Figure 4:
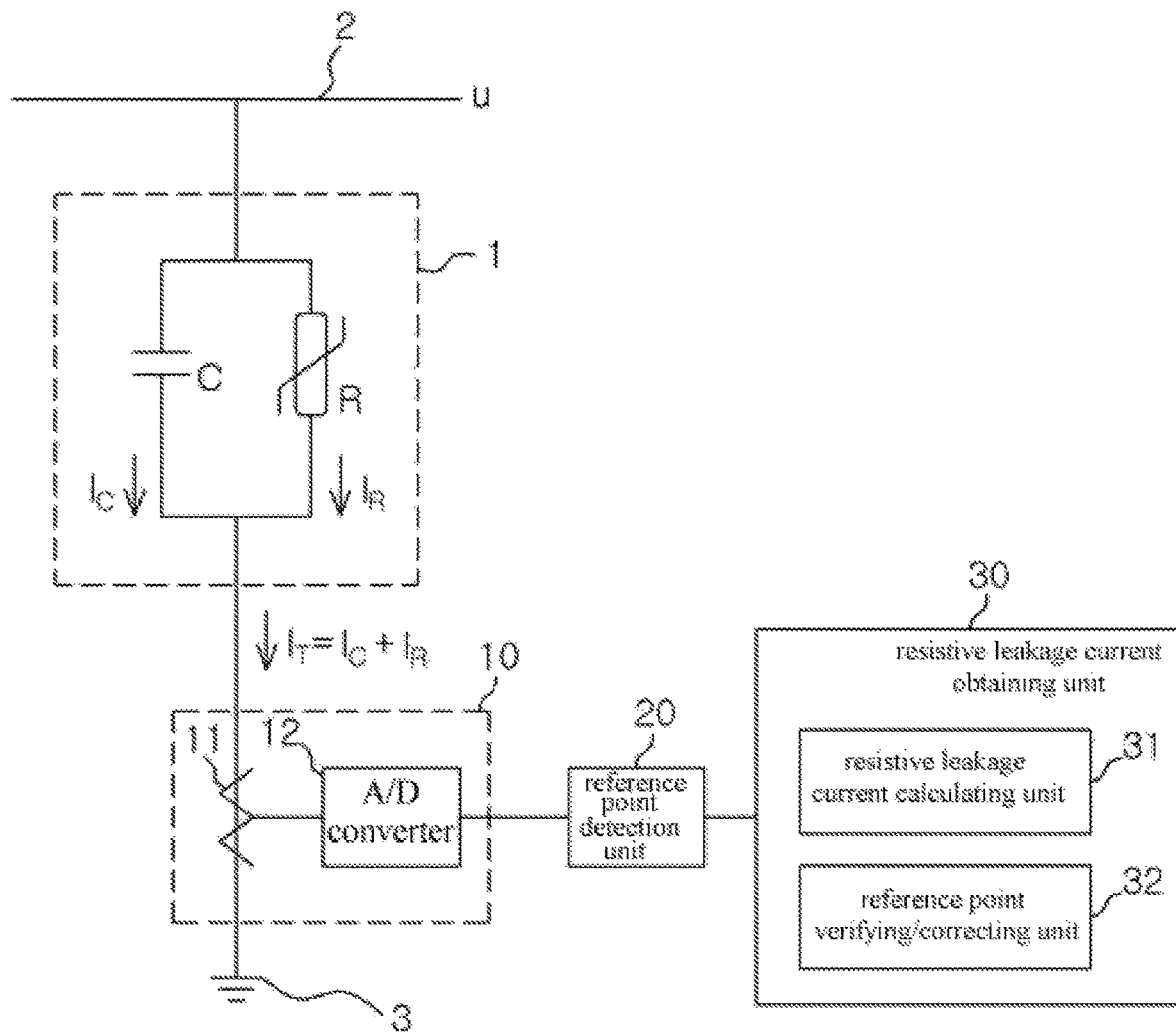
FIG. 4 is a block diagram illustrating a surge arrester resistive leakage current detector according to an embodiment of the present invention.

FIG. 4 is a block diagram illustrating a surge arrester resistive leakage current detector according to an embodiment of the present invention.

Figure 5:
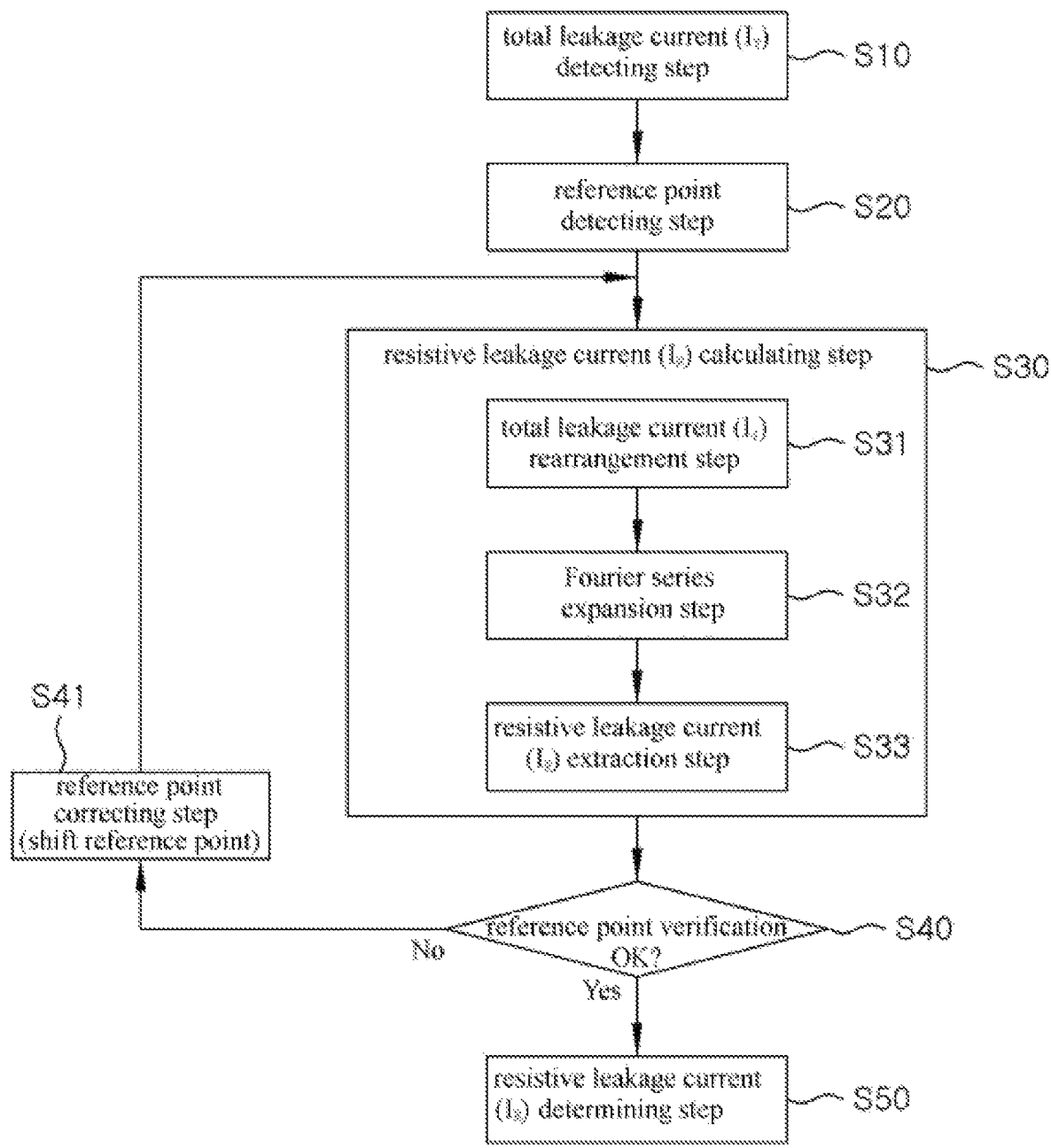
FIG. 5 is a flowchart illustrating a method of detecting a surge arrester resistive leakage current according to an embodiment of the present invention.

FIG. 5 is a flowchart illustrating a method of detecting a surge arrester resistive leakage current according to an embodiment of the present invention.

According to an embodiment of the present invention, a surge arrester resistive leakage current detector includes a leakage current detecting unit 10, a reference point detecting unit, and a resistive leakage current obtaining unit 30.

According to an embodiment of the present invention, a method for detecting a surge arrester resistive leakage current includes the step S10 of detecting a total leakage current by the leakage current detecting unit 10, the step S20 of detecting a reference point by the reference point detecting unit 20, the step S30 of calculating a resistive leakage current by the resistive leakage current obtaining unit 30, a reference point verifying step S40 and a reference point correcting step S41, and the step S50 of determining the resistive leakage current.

Figure 6:
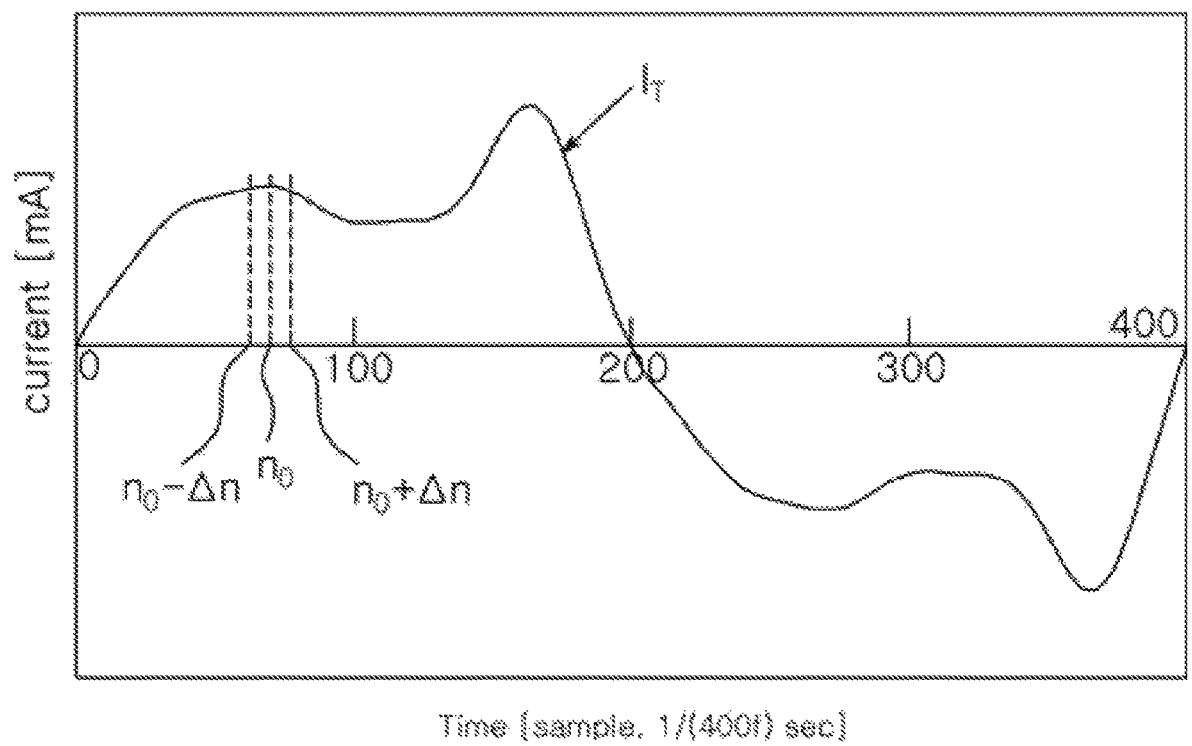
FIG. 6 is a waveform diagram of a total leakage current $I_T$ detected at a surge arrester 1 during one period, with a reference point $n_0$ indicated.

FIG. 6 is a waveform diagram of a total leakage current $I_T$ detected at a surge arrester 1 during one period, with a reference point $n_0$ indicated.

Figure 7:
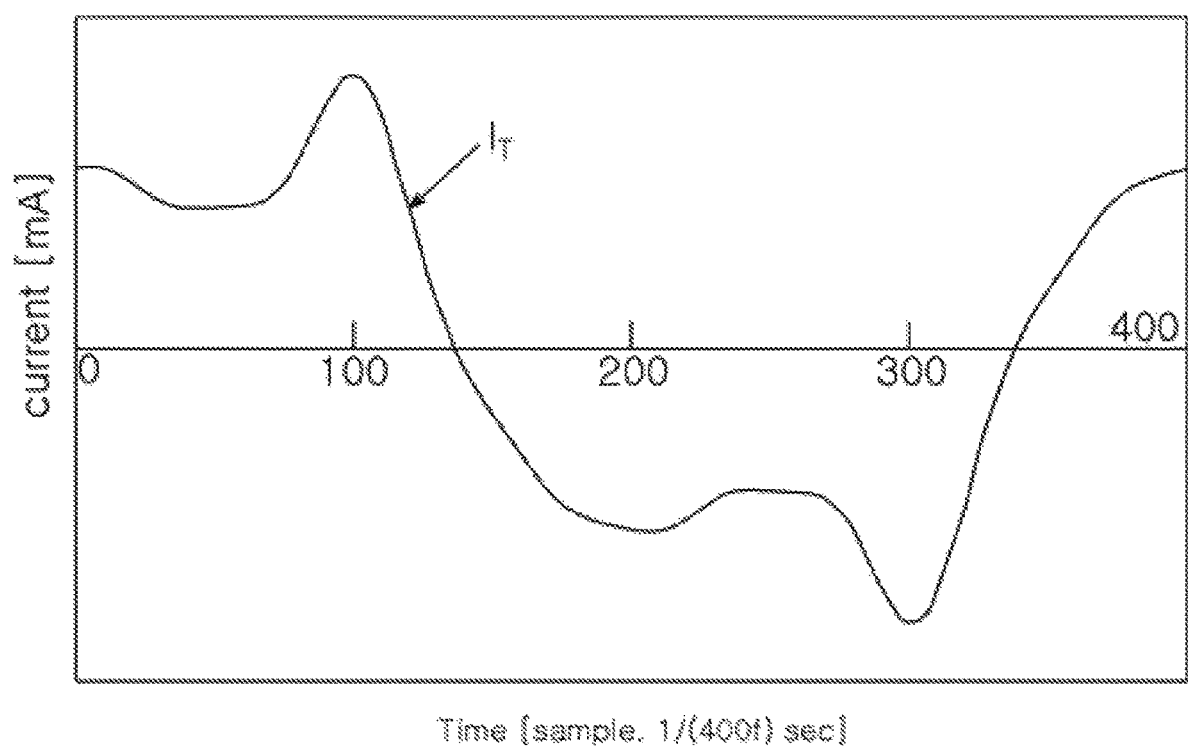
FIG. 7 is a waveform diagram of a total leakage current $I_T$ of one cycle, which starts at the reference point $n_0$ indicated in FIG. 6.

FIG. 7 is a waveform diagram of a total leakage current $I_T$ of one cycle, which starts at the reference point $n_0$ indicated in FIG. 6.

Figure 8:
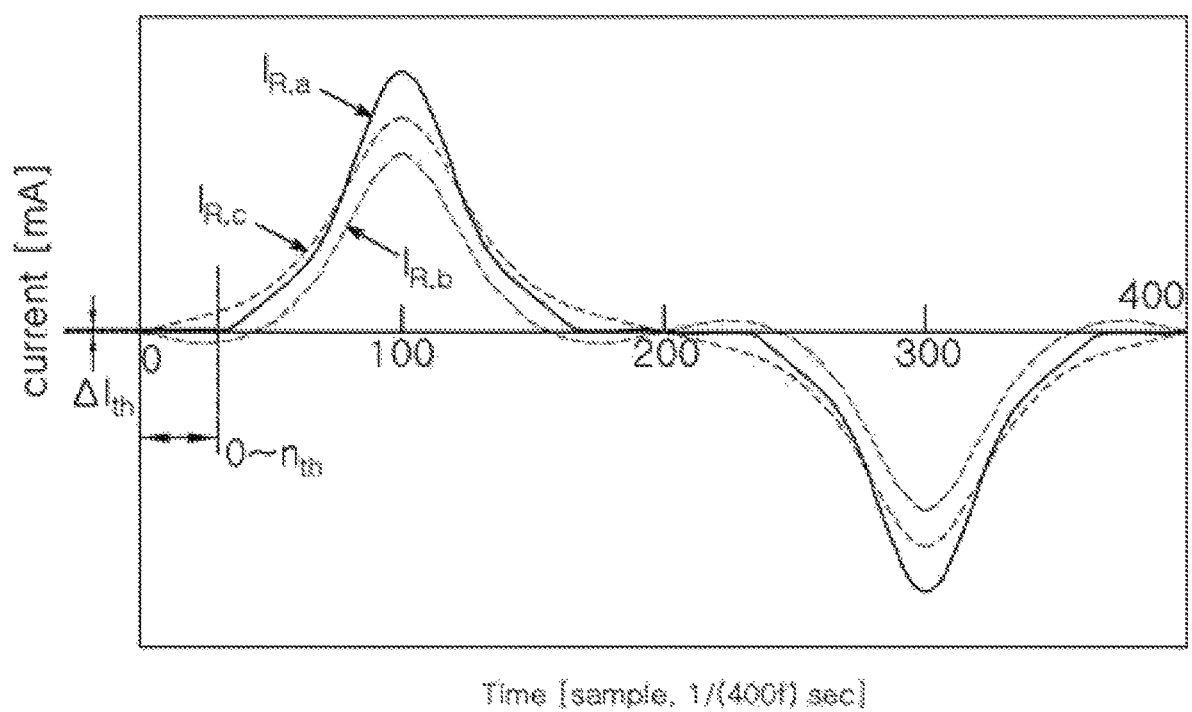
FIG. 8 is a view illustrating an example in which a resistive leakage current $I_R$ obtained by the Fourier series of a one-period total leakage current $I_T$ starting at a reference point $n_0$ may be varied per type of error in selecting the reference point $n_0$.

FIG. 8 is a view illustrating an example in which a resistive leakage current $I_R$ obtained by the Fourier series of a one-period total leakage current $I_T$ starting at a reference point $n_0$ may be varied per type of error in selecting the reference point $n_0$.

The surge arrester resistive leakage current detector of FIG. 4 and the method of FIG. 5 are described with reference to FIGS. 6 to 8.

The leakage current detecting unit 10 is a component that is connected between a system bus 2 and a ground line 3 to detect digital data for a total leakage current $I_T$ flowing through a surge arrester 1 to which a system voltage u has been applied through the system bus 2, and the leakage current detecting unit 10 performs the total leakage current detection step S10.

To that end, the leakage current detecting unit 10 includes a current transformer 11 installed between the surge arrester 1 and the ground line 3 and an A/D converter 12 that samples, in a predetermined amplified period, the analog total leakage current $I_T$ detected by the current transformer 11 to thereby detect the digital data for the total leakage current $I_T$.

Since the total leakage current $I_T$ has periodicity according to the system frequency f in its normal state where no abnormal voltage occurs, the detection was performed only for one period according to an embodiment of the present invention. For example, since the system frequency function in Korea is 60 Hz, the total leakage current $I_T$ may be detected during 1/60 sec. However, the values before and after the one-period total leakage current $I_T$ may be additionally detected and used so as to obtain the one-period total leakage current $I_T$ which starts at the varying reference point $n_0$ from time continuous data without rearrangement as described below.

Further, according to an embodiment of the present invention, one-period data which starts at 0 A within the rising interval of the total leakage current $I_T$ detected as the digital data may be extracted and be used to obtain the resistive leakage current $I_R$. As such, the interval for the one-period data may be clarified by using 0 A as the starting point.

FIG. 6 is a waveform graph of the one-period total leakage current $I_T$ starting at 0 A. The leakage current detecting unit 10 obtains digital data by performing sampling, e.g., N (=400) times during one period.

The reference point detecting unit 20 is a component that detects the time point when the applied voltage is 0V and selects the time point as a reference point $n_0$. The reference point detecting unit 20 performs the reference point detecting step S20.

According to an embodiment of the present invention, since the applied system voltage u is not detected, the reference point detecting unit 20 is configured to estimate the time when the applied voltage is 0V based on a characteristic pattern that occurs in the total leakage current $I_T$ when the voltage applied to the surge arrester is 0V.

Here, the characteristic pattern of the total leakage current $I_T$ is a pattern in which the highest left-right symmetry is shown when the applied voltage is 0V. As described above in connection with FIG. 2, a resistive leakage current $I_R$, although small enough to be neglectable, flows also in predetermined intervals before and after the time when the applied voltage is 0V. Further, the interval where left-right symmetry is shown with respect to the time when the applied voltage is 0V is limited to a short range.

Thus, the reference point detecting unit 20 is configured to obtain a left-right symmetry degree S(n) for predetermined intervals before and after each sample as exemplified in Equation 9 and select the position of the sample which exhibits the smallest left-right symmetry degree S(n). Thus, the time when the left-right symmetry is highest in the total leakage current $I_T$ may be selected as the reference point $n_0$.

$$S(n) = \sum_{i=1}^{\Delta n} (I_T(n-i) - I_T(n+i))^2 \quad \text{[Equation 9]}$$

In Equation 9 above, n denotes the sample order of the digital total leakage current $I_T$, and $\Delta n$ denotes the size of the before-and-after intervals. For example, $\Delta n$ may be five given that N (=400) samples are obtained during one period. In other words, the left-right symmetry degree may be calculated taking five samples before each sample and five samples thereafter.

Thus, the time when the highest left-right symmetry is shown as shown in FIG. 6 may be selected as the reference point $n_0$ when the applied voltage is 0V.

Further, according to an embodiment of the present invention, the time of 0V is selected as the reference point $n_0$ within the interval where the voltage arises. Since the total leakage current $I_T$ was taken during one period from the time of 0 A in the voltage rising interval, the time when the capacitive leakage current is dominant is within, at least, a range from 0 period to 1/4 period and, thus, the left-right symmetry degree for the range from 0 period to 1/4 period is obtained per sample, and the time when the lowest left-right symmetry degree is shown may be selected as the reference point.

If the reference point is detected based on Equation 9, two reference points may be detected during one period and, thus, either one needs to be selected. As described below, the time of 0V in the voltage rising interval needs to be selected as the reference point $n_0$ for verifying and correcting the reference point $n_0$. If the time of 0V in the voltage falling interval is taken as the reference point $n_0$, the verification needs to be modified to reflect the flow of a tiny negative (−) resistive leakage current $I_R$ during a predetermined interval after the reference point $n_0$.

The resistive leakage current obtaining unit 30 is a component that calculates the resistive leakage current $I_R$ by extracting a term from the Fourier series for the total leakage current $I_T$ for one period starting at the reference point $n_0$, verifies the accuracy of the reference point $n_0$ based on the pattern of the calculated resistive leakage current $I_R$, and, upon determining that the reference point $n_0$ is inaccurate, corrects the reference point $n_0$, and recalculates the resistive leakage current $I_R$ according to the corrected reference point $n_0$, thereby precisely obtaining the resistive leakage current $I_R$.

To that end, the resistive leakage current obtaining unit 30 includes a resistive leakage current calculating unit 31 and a reference point verifying/correcting unit 32.

The resistive leakage current calculating unit 31 is a component that calculates the resistive leakage current $I_R$ by adding the term, which is in phase with a virtual applied voltage which is 0V at the reference point $n_0$, of the Fourier series for the total leakage current $I_T$ during one period starting at the reference point $n_0$, and the resistive leakage current calculating unit 31 performs the resistive leakage current calculating step S30.

Specifically, the resistive leakage current calculating unit 31 sequentially performs a rearrangement step S31 to rearrange the one-period total leakage current $I_T$ allow the one-period total leakage current $I_T$ to start at the reference point $n_0$, a Fourier series expansion step S32 to obtain a Fourier series by Fourier-transforming the rearranged one-period total leakage current $I_T$, and a resistive leakage current $I_R$ extraction step S33 to calculate the resistive leakage current $I_R$ by adding the term of the Fourier series which is in phase with the voltage which is 0V at the reference point $n_0$.

FIG. 7 is a view illustrating the waveform obtained by performing the rearrangement step S31, which illustrates the waveform of the total leakage current $I_T$ rearranged to start at the reference point $n_0$ selected by the reference point detecting unit 20. Referring to FIG. 7, the total leakage current $I_T$ is rearranged in such a manner that the sample value before the reference point $n_0$ indicated in FIG. 6 is added to the tail, and this way may be represented as in Equation 10 below.

$$I_T(n)=I_T(n+n_0), n=0,1,2,\ldots,(N-1-n_0)$$

$$I_T(n+N-n_0)=I_T(n), n=0,1,2,\ldots,(n_0-1) \quad \text{[Equation 10]}$$

Here, N is the number of the samples of the one-period total leakage current $I_T$ as mentioned above and is 400 as an example. n is the sample number of the one-period total leakage current $I_T$.

In contrast, as a variation to the above-described embodiment, the leakage current detecting unit 10 may be configured to detect the total leakage current $I_T$ which exceeds one period in which case it is possible to obtain the continuous one-period total leakage current $I_T$ starting at the selected reference point $n_0$ without rearrangement.

As such, the Fourier series with the coefficient $a_m$ of the cosine term and the coefficient $b_m$ of the sine term as shown in Equation 11 below is obtained by performing the Fourier series expansion step S32 on the one-period total leakage current $I_T$ starting at the selected reference point $n_0$ to thereby discrete time Fourier-transform the same.

$$I_T(n) = \sum_{m=1}^{9} a_m \cos\left(m\frac{2\pi}{N}n\right) + \sum_{m=1}^{9} b_m \sin\left(m\frac{2\pi}{N}n\right), \quad \text{[Equation 11]}$$

$$n = 0, 1, 2, 3, \ldots, N-1$$

Of course, in Equation 11, m is 1, 3, 5, 7, or 9.

The Fourier coefficients $a_m$ and $b_m$ in the Fourier series of Equation 11 are expressed as in Equation 12 below.

$$a_m = \frac{2}{N}\sum_{n=0}^{N-1} I_T(n)\cos\left(m\frac{2\pi}{N}n\right), \quad m = 1, 3, 5, 7, 9 \quad \text{[Equation 12]}$$

$$b_m = \frac{2}{N}\sum_{n=0}^{N-1} I_T(n)\sin\left(m\frac{2\pi}{N}n\right), \quad m = 1, 3, 5, 7, 9$$

As described above in connection with Equations 8 and 9, if the selected reference point $n_0$ matches the time when the applied voltage u is 0V, the resistive leakage current $I_R$ which is in phase with the applied voltage u is the current component represented only as the sine term of the Fourier series of Equation 11, and the capacitive leakage current $I_C$ which is a lead phase current whose phase 90-degree leads the phase of the applied voltage u is the current component represented only as the cosine term.

Thus, the resistive leakage current $I_R$ and the capacitive leakage current $I_C$ may be obtained as in Equation 13 by performing the resistive leakage current $I_R$ extraction step S33.

$$I_R(n) = \sum_{m=1}^{9} b_m \sin\left(m\frac{2\pi}{N}n\right), n = 0, 1, \quad \text{[Equation 13]}$$

$$2, 3, \ldots, N-1, m = 1, 3, 5, 7, 9$$

$$I_C(n) = \sum_{m=1}^{9} a_m \cos\left(m\frac{2\pi}{N}n\right), \quad n = 0, 1, 2, 3, \ldots, N-1, \quad m = 1, 3, 5, 7, 9$$

However, the reference point may be inaccurate due to influence by, e.g., detection errors or noise introduced to the detected total leakage current $I_T$.

The reference point verifying/correcting unit 32 verifies the accuracy of the reference point and, if the reference point is determined to be inaccurate as a result of the verification, corrects the reference point so that the resistive leakage current calculating unit 31 recalculates the resistive leakage current according to the corrected reference point. If the reference point is determined to be accurate, the resistive leakage current calculated according to the reference point determined to be accurate is determined to be the resistive leakage current of the surge arrester 1.

To that end, the reference point verifying/correcting unit 32 is configured to sequentially perform the reference point verifying/correcting steps S40 and S41 to correct the reference point until the calculated resistive leakage current $I_R$ shows the characteristic pattern of the resistive leakage current $I_R$ according to the non-linear resistance characteristics of the surge arrester 1 so that the resistive leakage current calculating unit 30 recalculates the resistive leakage current $I_R$ according to the corrected reference point and the resistive leakage current determining step S50 to determine that the resistive leakage current $I_R$ calculated according to the completely corrected reference point is the resistive leakage current of the surge arrester 1.

In a specific embodiment of the present invention, the reference point is verified for its accuracy and corrected using the characteristic pattern which is shown as a value not more than a preset tiny current ($\Delta I_{th}$) form the time when the voltage is 0V until a predetermined time elapses.

FIG. 8 is a view illustrating that the waveform diagram of the resistive leakage current $I_R$ obtained with the Fourier series of the total leakage current $I_T$ which takes the reference point $n_0$ as the start point may be varied per type of reference point $n_0$ selection error.

Referring to FIG. 8, three types of waveforms $I_{R,a}$, $I_{R,b}$, and $I_{R,c}$ are shown.

The waveform $I_{R,a}$ is the resistive leakage current $I_R$ obtained when the time when the applied voltage u is exactly 0V is selected as the reference point $n_0$. As described above in connection with FIG. 3, since a current not more than a tiny current $\Delta I_{th}$ small enough to be neglectable flows in a predetermined length of initial interval 0 to nth which starts at 0, substantially 0 A current flows. In other words, the resistive leakage current $I_R$ flowing in the initial interval 0 to nth is not less than 0 A but is not more than $\Delta I_{th}$ which is neglectable.

In contrast, if a time departing from the time when the applied voltage u is 0V is selected as the reference point $n_0$, the waveform $I_{R,b}$ or $I_{R,c}$ is shown.

The waveform $I_{R,b}$ is a waveform shown when a time after the time when the applied voltage u is 0V is selected as the reference point and has a portion, where the resistive leakage current $I_R$ is less than 0 A, in the initial interval 0 to nth.

The waveform $I_{R,c}$ is a waveform shown when a time before the time when the applied voltage u is 0V is selected as the reference point and has a portion, where the resistive leakage current $I_R$ exceeds the neglectable value $\Delta I_{th}$, in the initial interval 0 to nth.

Thus, the reference point verifying/correcting unit 32 corrects the reference point so that the resistive leakage current $I_R$ is not more than $\Delta I_{th}$ during the preset length of initial interval 0 to nth when performing the reference point verifying/correcting steps S40 and S41. Of course, if the resistive leakage current $I_R$ stays not more than $\Delta I_{th}$ during the initial interval 0 to nth, the reference point is not corrected but is applied as it is.

As a scheme for correcting the reference point, if the portion where the resistive leakage current $I_R$ is less than 0 A occurs in the initial interval 0 to nth, the reference point is brought forward and, if the portion where the resistive leakage current $I_R$ exceeds $\Delta I_{th}$ occurs in the initial interval 0 to nth, the reference point is put off.

However, it suffices to perform verification on at least two or more time points without the need for verifying over the entire initial interval 0 to nth.

Again, as mentioned above, it is very hard to precisely correct the reference point due to noise or current detection errors.

Thus, according to an embodiment of the present invention, two time points are selected from the initial interval 0 to nth and, as the waveform $I_{R,b}$ or $I_{R,c}$ occurs, correction is performed using a boundary condition considering the sign and magnitude of the tiny current value $\Delta I_{th}$ of the initial interval 0 to nth.

In a specific example, one time point and another, respectively corresponding to the phase $\pi/18=10°$ and the phase $\pi/9=20°$, are selected from the initial interval 0 to nth and, when the resistive leakage current is less than 0 A at, at least one, of the two time points, the reference point is stepwise brought forward per sample until the resistive leakage current becomes not less than 0 A at both the time points.

Further, when the resistive leakage current exceeds the preset tiny current value $\Delta I_{th}$ at both the time points, the reference point is stepwise put off per sample until the resistive leakage current becomes 0 A or less at, at least, one of the two time points.

In an equational representation, if $I_R(\pi/18)<0$ or $I_R(\pi/9)<0$, this corresponds to the waveform $I_{R,b}$ of FIG. 8, and, thus, the reference point is brought one step forward per sample, and it is identified whether the condition: $I_R(\pi/18)\geq 0$ and $I_R(\pi/9)\geq 0$ is met, and if the condition is not met, the reference point is brought one step further forward. This step is repeated. If the condition is met, the reference point correcting step is completed.

Since if $I_R(\pi/18)>\Delta I_{th}$ and $I_R(\pi/9)>\Delta I_{th}$, then this corresponds to the waveform $I_{R,c}$ of FIG. 8. Thus, the reference point is one step put off per sample and it is identified whether the condition: $I_R(\pi/18)\leq 0$ and $I_R(\pi/9)\leq 0$ is met. If the condition is not met, the step of stepwise putting off the reference point is repeated. If the condition is met, the reference point correcting step is finished.

Of course, under the other conditions, i.e., if neither the condition: $I_R(\pi/18)<0$ or $I_R(\pi/9)<0$ nor the condition: $I_R(\pi/18)>\Delta I_{th}$ and $I_R(\pi/9)>\Delta I_{th}$ is met, the reference point detected by the reference point detecting unit 20 is used as it is without reference point correction.

As such, as the reference point verifying/correcting unit 32 performs the reference point verifying/correcting steps S40 and S41 and the resistive leakage current determining step S50, the time when the applied voltage is 0V, i.e., the zero crossing time, may be exactly detected even under the context where the applied voltage is not detected and, thus, the resistive leakage current $I_R$ may be precisely obtained although it is obtained by selecting the sine term of the Fourier series.

Further, the resistive leakage current determining step S50 may record and store or output the Fourier coefficient $a_m$ of the cosine term and the Fourier coefficient $b_m$ of the sine term expressed in Equation 12, determine the capacitive leakage current $I_C$ and the resistive leakage current $I_R$ obtained by Equation 13, and record and store or output the current data so that the resistive leakage current $I_R$ and the capacitive leakage current $I_C$ both may be analyzed upon determining insulation degradation, and the resistive leakage current $I_R$ and the capacitive leakage current $I_C$ may be analyzed per harmonic component.

Meanwhile, for the initial interval 0 to nth, at least two or more time points selected from the initial interval 0 to nth, and the tiny current value $\Delta I_{th}$ in the initial interval 0 to nth, which are intended for verifying the accuracy of the reference point, proper values may previously be set considering the characteristics which are shown before and after the time when the voltage is 0V among the non-linear resistance characteristics of the surge arrester 1, and the preset proper values may be used.

While the present invention has been shown and described in connection with specific embodiments thereof, it should be noted that various changes or modifications may be made thereto without departing from the scope of the present invention which is determined by the claims as follows.

[Description of Reference Numbers]

1: surge arrester
2: system bus
3: ground line
10: leakage current detecting unit
11: current transformer
12: A/D converter
20: reference point detecting unit
30: resistive leakage current obtaining unit
31: resistive leakage current calculating unit
32: reference point verifying/correcting unit

The invention claimed is:

1. A method of detecting a surge arrester resistive leakage current, the method comprising:
   a total leakage current detecting step (S10) to detect a total leakage current ($I_T$) flowing through a surge arrester (1) to which a voltage has been applied;
   a reference point detecting step (S20) to detect a time when a voltage is 0V based on a characteristic pattern shown in the total leakage current ($I_T$) when the applied voltage is 0V and to select the time as a reference point;
   a resistive leakage current calculating step (S30) to calculate a resistive leakage current ($I_R$) by adding a term, which is in phase with a voltage which is 0V at the reference point, of a Fourier series of the total leakage current ($I_T$) for one period starting at the reference point;

reference point verifying/correcting steps (S40 and S41) to correct the reference point until the calculated resistive leakage current ($I_R$) shows a characteristic pattern of the resistive leakage current ($I_R$) according to non-linear resistance characteristics of the surge arrester (1) and to repeat the resistive leakage current calculating step (S30); and a resistive leakage current determining step (S50) to determine that the resistive leakage current ($I_R$) calculated based on the corrected reference point is the resistive leakage current of the surge arrester (1).

2. The method of claim 1, wherein the characteristic pattern shown in the total leakage current ($I_T$) when the applied voltage is 0V is a pattern in which left-right symmetry is highest, and wherein the reference point detecting step (S20) selects a time when a predetermined range of left-right symmetry is highest in the total leakage current ($I_T$) as the reference point.

3. The method of claim 1, wherein the reference point detecting step (S20) detects a time of 0V in a voltage rising interval and selects the time of 0V as the reference point.

4. The method of claim 1, wherein in the resistive leakage current calculating step (S30), the term added to calculate the resistive leakage current ($I_R$) of the Fourier series of the one-period total leakage current ($I_T$) is a sine term.

5. The method of claim 1, wherein in the reference point verifying/correcting steps (S40 and S41), the characteristic pattern of the resistive leakage current ($I_R$) is a pattern in which a value not more than a preset tiny current value ($\Delta I_{th}$) during a predetermined length of initial interval starting from the time when the voltage is 0V, and wherein the reference point verifying/correcting steps (S40 and S41) correct the reference point until the resistive leakage current ($I_R$) becomes the preset current value ($\Delta I_{th}$) or less during the preset length of initial interval.

6. The method of claim 5, wherein the reference point verifying/correcting steps (S40 and S41) select a plurality of time points within the preset initial interval, if the resistive leakage current ($I_R$) is less than 0A at, at least one of the plurality of time points, stepwise bring the reference point forward until the resistive leakage current ($I_R$) becomes 0A or more at all of the plurality of time points, and, if the resistive leakage current ($I_R$) exceeds the preset current value ($\Delta I_{th}$) at all of the plurality of time points, stepwise put off the reference point until the resistive leakage current ($I_R$) is 0A or less at, at least one, of the plurality of time points.

7. A surge arrester resistive leakage current detector, comprising:

a leakage current detecting unit (10) being connected between a system bus and a ground line to detect digital data for a total leakage current ($I_T$) flowing through a surge arrester (1) to which a voltage has been applied through the system bus and including a current transformer installed between the surge arrester and the ground line and an A/D converter that samples, in a predetermined amplified period, the analog total leakage current ($I_T$) detected by the current transformer to thereby detect the digital data for the total leakage current ($I_T$);

a reference point detecting unit (20) to detect a time when a voltage is 0V based on a characteristic pattern shown in the total leakage current ($I_T$) when the applied voltage applied to the surge arrester is 0V since the applied system voltage is not detected and to select the time as a reference point;

a resistive leakage current calculating unit (31) to calculate a resistive leakage current ($I_R$) by adding a term, which is in phase with a virtual applied voltage which is 0V at the reference point, of a Fourier series of the total leakage current ($I_T$) for one period starting at the reference point, wherein the resistive leakage current calculating unit sequentially performs rearranging the one-period total leakage current to start at the reference point, obtaining a Fourier series by Fourier-transforming the rearranged one-period total leakage current, and calculating the resistive leakage current by adding the term of the Fourier series which is in phase with the voltage which is 0V at the reference point; and a reference point verifying/correcting unit (32) to correct the reference point until the calculated resistive leakage current ($I_R$) shows a characteristic pattern of the resistive leakage current ($I_R$) according to non-linear resistance characteristics of the surge arrester (1) and to repeat the resistive leakage current calculating and to determine that the resistive leakage current ($I_R$) calculated based on the corrected reference point is the resistive leakage current (1), wherein the reference point verifying/correcting unit verifies the of the surge arrester accuracy of the reference point and, if the reference point is determined to be inaccurate as a result of the verification, corrects the reference point so that the resistive leakage current calculating unit recalculates the resistive leakage current according to the corrected reference point, and if the reference point is determined to be accurate, the resistive leakage current calculated according to the reference point determined to be accurate is determined to be the resistive leakage current of the surge arrester.

8. The surge arrester resistive leakage current detector of claim 7, wherein the characteristic pattern shown in the total leakage current ($I_T$) when the applied voltage is 0V is a pattern in which left-right symmetry is highest, and wherein the reference point detecting unit (20) selects a time when a predetermined range of left-right symmetry is highest in the total leakage current ($I_T$) as the reference point.

9. The surge arrester resistive leakage current detector of claim 7, wherein the reference point detecting unit (20) detects a time of 0V in a voltage rising interval and selects the time of OV as the reference point.

10. The surge arrester resistive leakage current detector of claim 7, wherein in the resistive leakage current calculating unit (31), the term added to calculate the resistive leakage current ($I_R$) of the Fourier series of the one-period total leakage current ($I_T$) is a sine term.

11. The surge arrester resistive leakage current detector of claim 7, wherein in the reference point verifying/correcting unit (32), the characteristic pattern of the resistive leakage current (IR) is a pattern in which a value not more than a preset tiny current value ($\Delta I_{th}$) during a predetermined length of initial interval starting from the time when the voltage is 0V, and wherein the reference point verifying/correcting unit (32) corrects the reference point until the resistive leakage current ($I_R$) becomes the preset current value ($\Delta I_{th}$) or less during the preset length of initial interval.

12. The surge arrester resistive leakage current detector of claim 11, wherein the reference point verifying/correcting unit (32) selects a plurality of time points within the preset initial interval, if the resistive leakage current ($I_R$) is less than 0A at, at least one of the plurality of time points, stepwise brings the reference point forward until the resistive leakage current ($I_R$) becomes 0A or more at all of the plurality of time points, and, if the resistive leakage current ($I_R$) exceeds the preset current value ($\Delta I_{th}$) at all of the plurality of time points, stepwise puts off the reference point until the resistive leakage current ($I_R$) is 0A or less at, at least one, of the plurality of time points.

* * * * *